United States Patent [19]
Haley et al.

[11] Patent Number: 5,600,236
[45] Date of Patent: Feb. 4, 1997

[54] CONVERTER AND DIGITAL CHANNEL SELECTOR

[75] Inventors: Mark W. Haley; Eric A. Sparks, both of San Antonio, Tex.

[73] Assignee: VLAI Technology, Inc., San Jose, Calif.

[21] Appl. No.: 333,009

[22] Filed: Nov. 1, 1994

[51] Int. Cl.$^6$ ........................................ G01R 1/04
[52] U.S. Cl. ........................................ 324/158.1; 324/72.5
[58] Field of Search ............................ 324/73 R, 72.5, 324/758, 158.1, 73 PC, 73

[56] References Cited

U.S. PATENT DOCUMENTS

| | | | |
|---|---|---|---|
| 3,665,303 | 5/1972 | Richards et al. | 324/73 |
| 4,038,599 | 7/1977 | Bove et al. | 324/158.1 |
| 5,070,297 | 12/1991 | Kwon et al. | 324/158.1 |
| 5,206,582 | 4/1993 | Ekstadt et al. | 324/73.1 |

Primary Examiner—Maura K. Regan
Assistant Examiner—Barry C. Bowser
Attorney, Agent, or Firm—Patrick T. King

[57] ABSTRACT

A converter and digital channel selector device is provided which is interconnected between a source measurement unit having a plurality of output terminal connectors and a probe station having a plurality of input probe terminal connectors. The channel selector device is used to selectively connect each one of the plurality of output terminals of the source measurement unit to corresponding one of the plurality of input probe terminal connectors, respectively. The channel selector device includes a converter for generating a plurality of digital control signals and a digital channel select logic circuit which is responsive to the digital control signals for selectively connecting respective ones of a plurality of its input channel connectors connected to the plurality of output terminal connectors to any one of a plurality of its output channel connectors connected to the plurality of input probe terminal connectors.

6 Claims, 3 Drawing Sheets

CONVERTER AND DIGITAL CHANNEL SELECTOR

BACKGROUND OF THE INVENTION

This invention relates generally to signal selection apparatus and more particularly, to a converter and digital channel selector device interconnected between a source measurement unit having a plurality of output terminal connectors and a probe station having a plurality of input probe terminal connectors for selectively connecting each one of the plurality of output terminal connectors of the source measurement unit to any corresponding one of the plurality of input probe terminal connectors, respectively.

As is generally known in the prior art, the input terminal connectors of signal probes are typically connected via BNC-type or TRIAC-type connectors to the output terminal connectors of a signal source/measuring device for applying or measuring at desired test locations on a wafer of a semiconductor integrated circuit device. These signal probes are provided with suitable probe tips so as to easily secure the signal probes to the number of desired locations. Such a signal source/measuring device is one which is commercially available from Hewlett Packard of Palo Alto, Calif. under their Model No. HP4145. The HP4145 device is a source measuring unit which is sometimes referred to as a Semiconductor Parameter Analyzer. This source measurement unit has now been recognized as a standard in the semiconductor industry to be used for performing DC measurements.

Specifically, the HP4145 device is equipped with four source measuring units and two voltage sources and has the capability of storing on a floppy disc the configuration of its output terminal connectors for a particular test measurement to be made. Accordingly, when the same test measurement is to be repeated at a time in the future this can be achieved by simply loading the stored program. Further, certain types of test measurements have become so common in the semiconductor technology that they have now also become standards and are thus quite frequently formed in the normal routine of measurements.

However, in the situations where the multiple probes on the same source measurement unit are used to obtain a number of different test measurements there is created the problem of requiring the user to disconnect the BNC-type or TRIAC-type connectors from each of the multiple probes and then re-connect the same connectors to a different one of the multiple probes in order to change the function of each of the probes without having to re-program the stored output terminal connector configuration of the source measuring unit. This problem arises due to the fact that these output terminal connectors of the source measurement unit as stored in the program will seldom correlate or match up with the input terminal connectors of the probes whose tips are secured to the desired test locations for each of the number of different test measurements to be performed at the wafer level of the semiconductor integrated circuit device.

It would therefore be desirable to provide a converter and digital channel selector device which allows a user to quickly and easily reassign the function of the multiple probes coupled to the output terminal connectors of the same source measurement unit. It would also be expedient to have this implemented by the user without requiring re-programming of the source measurement unit or swapping of the terminal connectors.

SUMMARY OF THE INVENTION

Accordingly, it is a general object of the present invention to provide a converter and digital channel selector device which is relatively simple and economical to manufacture and assemble, but yet overcomes the aforementioned disadvantage and problems encountered in the prior art.

It is an object of the present invention to provide a converter and digital channel selector device which allows a user to quickly and easily reassign the function of the multiple probes coupled to the output terminal connectors of the same source measurement unit.

It is another object of the present invention to provide a converter and digital channel selector device for use with a source measurement unit which allows multiple inputs or measurements to be taken from the same plurality of probes without requiring re-programming of the source measurement unit or swapping of terminal connectors.

It is still another object of the present invention to provide a converter and digital channel selector device which is interconnected between a source measurement unit having a plurality of output terminal connectors and a probe station having a plurality of input probe terminal connectors for selectively connecting each one of the plurality of output terminal connectors of the source measurement unit to any corresponding one of the plurality of input probe terminal connectors, respectively.

It is yet still another object of the present invention to provide a converter and digital channel selector device which is formed of a converter for generating a plurality of digital control signals and a digital channel selector logic circuit responsive to the digital control signals for selectively connecting respective ones of a plurality of its input channel connectors to any corresponding one of a plurality of its output channel connectors.

In accordance with these aims and objectives, the present invention is concerned with the provision of a converter and digital channel selector device for use with a source measurement unit and a probe station. The source measurement unit has a plurality of output terminal connectors connected to receive corresponding ones of a plurality of signals. The probe station has a plurality of probes in which each has its probe tip fixedly secured to a different test point on a wafer of a semiconductor integrated circuit. The channel selector device includes a plurality of input channel connectors being connected to corresponding ones of the plurality of output terminal connectors of the source measurement unit and a plurality of output channel connectors being connected to corresponding ones of the plurality of probes.

The channel selector device further includes a converter for generating a plurality of digital control signals and a digital channel selector logic circuit responsive to the digital control signals for selectively connecting respective ones of the plurality of input channel connectors to any corresponding one of the plurality of output channel connectors. The logic circuit selectively applies each one of the plurality of signals from the source measuring unit to any one of the corresponding plurality of probes.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
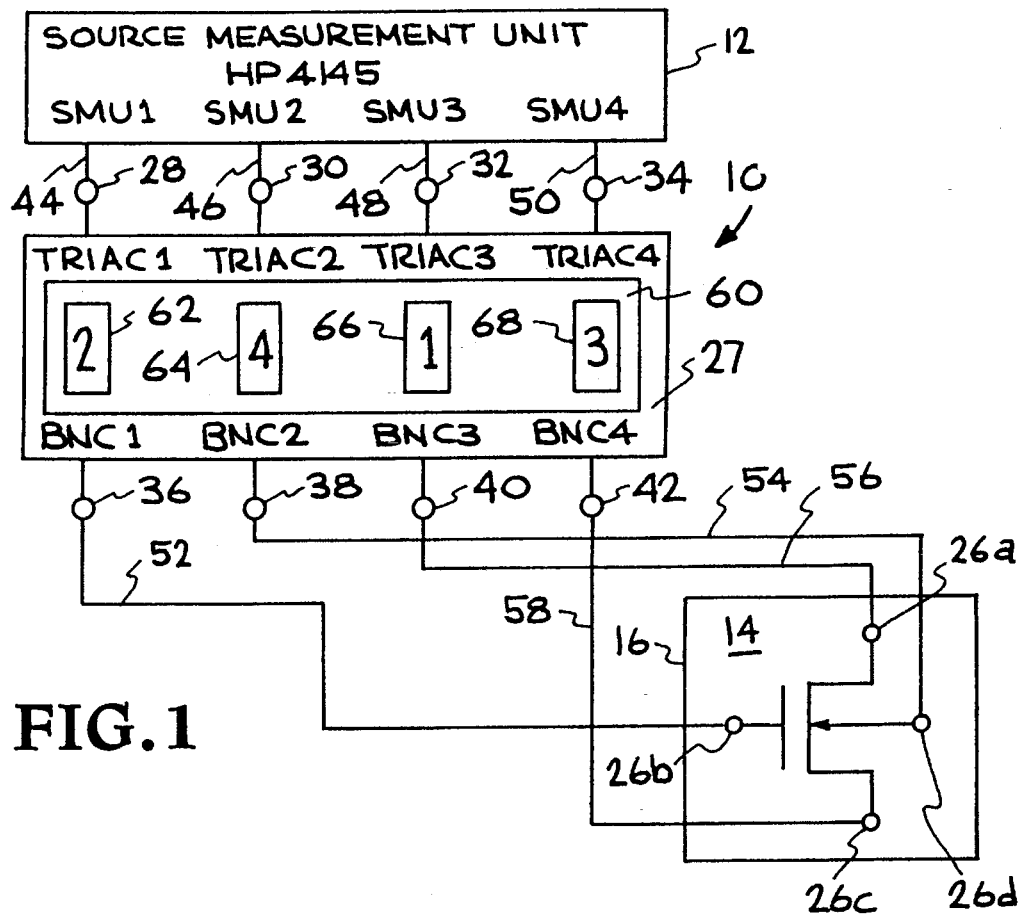
FIG. 1 is a pictorial representation of a converter and digital channel selector device of the present invention which is used to interconnect a source measuring unit to various desired test points on a wafer of a semiconductor integrated circuit device by multiple probes.
Figure 2:
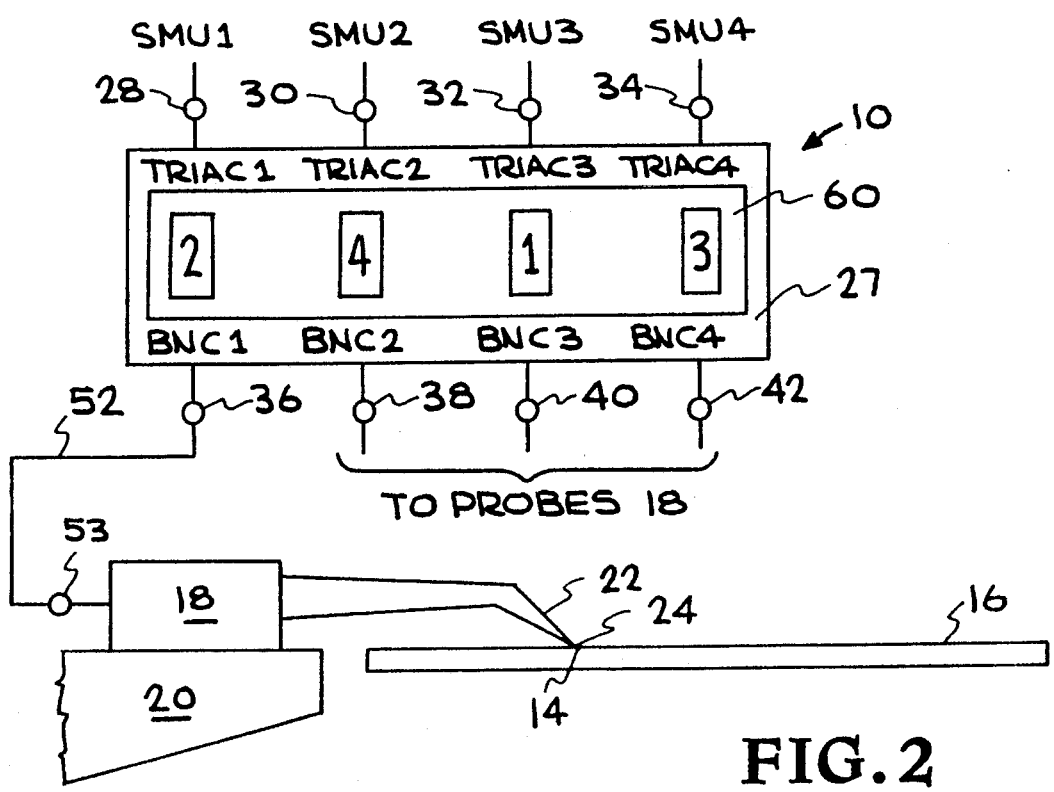
FIG. 2 is a pictorial representation of a typical connection from one of the output channel connectors of the channel selector device to the probe tip secured to a test point on the wafer.

Referring now in detail to the various view of the drawings, there is illustrated in FIG. 1 a pictorial representation of a converter and digital channel selector device 10 of the present invention which is interconnected between a source measurement unit 12 and a wafer 14 of a semiconductor integrated circuit device 16. In FIG. 2, there is depicted a pictorial representation of a typical connection from one of the output channel connectors of the channel selector device 10 to a probe 18 mounted on a probe station 20. It should be understood that the probe station 20 can house a number of probes 18 (only one of which is shown) whose probe tip 22 is suitably secured fixedly to a test point on location 24 on the wafer 14. For the sake of simplicity, the probe station 20 of FIG. 2 which includes the plurality of probes 18 each having a probe tip 22 which is connected to a different test point or location on the wafer 14 has been purposely omitted from FIG. 1.

Referring now back to FIG. 1, the source measurement unit 12 is comprised of a Semiconductor Parameter Analyzer which is manufactured by Hewlett Packard and sold under their part designation as HP4145. The HP4145 device or measurement unit 12 includes four (4) output terminal connectors SMU1, SMU2, SMU3, and SMU4. Each of the terminal connectors SMU1–SMU4 is a TRIAC-type connector. In order to facilitate repeated measurements, it will be assumed that one particular configuration of the output terminal connectors of the HP4145 source measurement unit 12 has been programmed and stored therein. For example, the output terminal connector SMU1 has been programmed to receive the drain connection or test point 26a on the wafer 14 under test, and the output terminal connector SMU2 has been programmed to receive a gate connection or test point 26b on the wafer under test. Similarly, the output terminal connector SMU3 has been programmed to receive a source connection or test point 26c, and the output terminal connector SMU4 has been programmed to receive a substrate connection or test point 26d.

The channel selector device 10 includes an enclosure 27 having a plurality of input channel connectors 28, 30, 32, and 34 located on one side of the enclosure and a plurality of output channel connectors 36, 38, 40, and 42 located on the opposite side of the enclosure. Each of the input channel connectors 28–34 is a TRIAC-type connector, TRIAC-TRIAC4, each of the output channel connectors 36–42 is a BNC-type connector, BNC1–BNC4. As can be seen from FIG. 1, a first cable 44 has its one end connected to the first output terminal connector SMU1 of the measurement unit 12 and its other end connected to the first input channel connector TRIAC1 of the channel selector device 10. A second cable 46 has its one end connected to the second output terminal connector SMU2 of the measurement unit 12 and its other end connected to the second input channel connector TRIAC2 of the channel selector device 10. Further, a third cable 48 has its one end connected to the third output terminal connector SMU3 of the measurement unit and its other end connected to the third input channel connector TRIAC3 of the channel selector device. Finally, a fourth cable 50 has its one end connected to the fourth output terminal connector SMU4 of the measurement unit and its other end connected to the fourth input channel connector TRIAC4 of the channel selector device.

A fifth cable 52 has its one end connected to the first output channel connector BNC1 and its other end connected to an input terminal connector 53 of the probe 18 (FIG. 2) whose probe tip 22 is suitably secured fixedly to the test point or gate 26b of the wafer 14 under test. Similarly, a sixth cable 54 has its one end connected to the second output channel connector BNC2 and its other end connected to the test point or substrate 26d via a corresponding-like probe with a probe tip. Further, a seventh cable 56 has its one end connected to the third output channel connector BND3 and its other end connected to the test point or drain 26a via a corresponding-like probe with a probe tip. Lastly, an eighth cable 58 has its one end connected to a fourth output channel connector BNC4 and its other end connected to the test point or source 26c via corresponding-like probes with a probe tip.

The channel selector device 10 further includes a control portion 60 defining digital input converter switch means which is formed of a plurality (four) of thumbwheel code switches 62, 64, 66, and 68. Each of the thumbwheel switches is operable manually by a user for selecting a digit between 0 and 9. The control portion 60 of the channel selector device serves to allow the user to have the ability to quickly and easily assign the signals of each one of the plurality of output terminal connectors from the first measurement unit 12 connected to its associated input channel connectors to be applied to any one of the plurality of probes 18 connected to its associated output channel connectors.

In order to perform the test measurements in accordance with the stored configuration of the output terminal connectors of the source measurement unit 12 as discussed above, the thumbwheel switches 62–64 must be set as shown in FIG. 1. With the first thumbwheel switch 62 being set to the digit number 2, the first output channel connector BNC1 of the channel selector device 10 (also the test point or gate 26b) will be derived from the second output terminal connector SMU2 of the source measurement unit 12 so as to correlate with the stored program. Further, with the second thumbwheel switch 64 being set to the digit number 4, the second output terminal connector BNC2 of the channel selector (also test point or substrate 26d) will be derived from the fourth output terminal connector SMU4 of the measurement unit. Similarly, with the third switch 66 being set to the digit number 1, the third output terminal connector BNC3 of the channel selector (also test point or drain 26a) will be derived from the first output terminal connector SMU1. Further, with the fourth switch 68 being set to the digit number 3, the fourth output channel connector BNC4 of the channel selector (also test point or source 26c) will be derived from the third output terminal connector SMU3.

As a result, it can thus be seen there is complete user control of assigning each of the signals from the output terminal connectors SMU1–SMU4 to be at a particular corresponding one of the output channel connectors BNC1–BNC4 so that it can be applied selectively to various desired test points on the wafer by the input terminals of the plurality of probes with probe tips, thereby permitting flexibility in making different test measurements without requiring the re-programming of the source measurement unit or swapping of probe connectors.

Figure 3A:
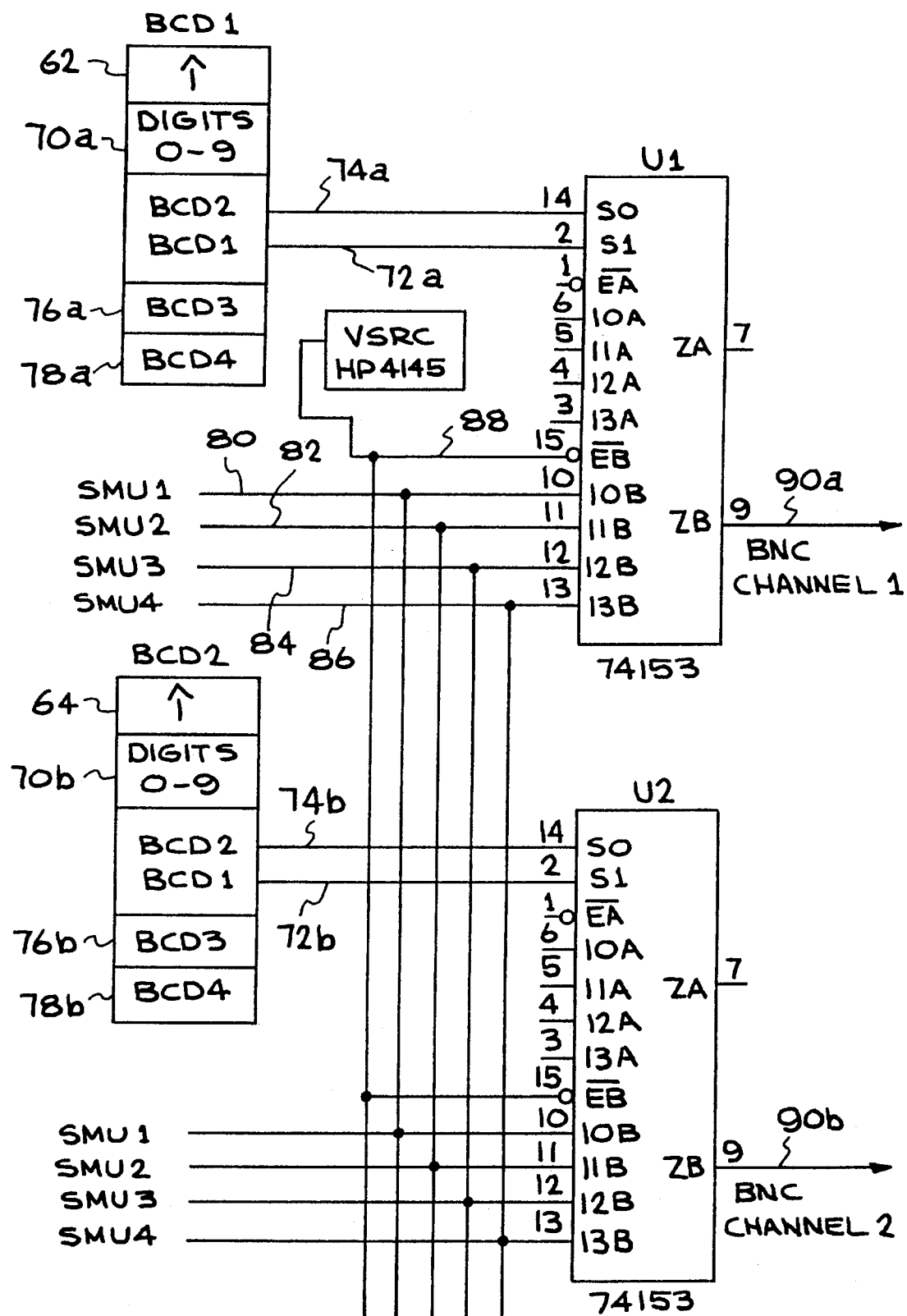
FIGS. 3(a) and 3(b) are detailed schematic circuit diagrams of the channel selector device, constructed in accordance with the principles of the present invention.
Figure 3B:
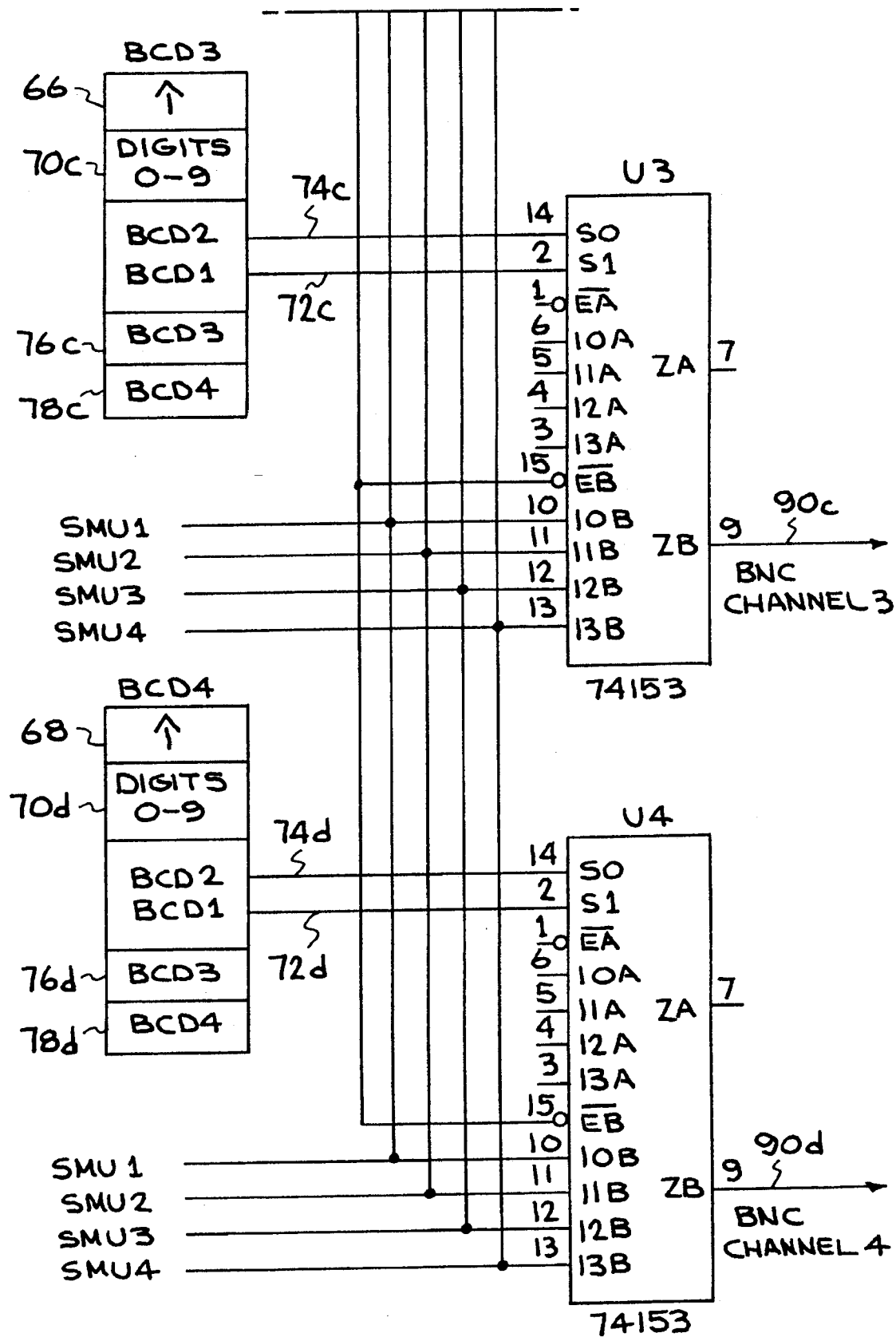

In FIG. 3, there is shown a detailed schematic circuit diagram of the channel selector device 10 of FIGS. 1 and 2. The channel selector device 10 includes the digital input converter switch means formed by four thumbwheel switches 62–68 and digital channel selector logic circuit formed by four I.C. multiplexer chips U1–U4. Each of the switches 62–68 has a pushwheel (not shown) which is operated manually for selecting a digit number between 0 and 9. The switches 62–68 are used to encode the selected digits into a BCD code. In response to the four selected digits applied on the input lines 70a–70d of the switches 62–64, the four BCD codes defining digital control signal will appear on corresponding output terminals BCD1–BCD4 of the switches.

Each of the multiplexer chips U1–U4 is a 74153. Alternatively, 74151's are used. Since each of the multiplexer chips U1–U4 are identical, it will be sufficient to describe in detail only the chip U1. The multiplexer chip U1 has four data input terminals 10B, 11B, 12B, and 13B on respective pins 10–13 which are connected to one end of respective lines 80, 82, 84 and 86. The other end of the respective lines 80–86 are connected to the corresponding input channel connectors TRIAC1–TRIAC4. The multiplexer chip U1 also has an enable terminal on pin 15 which is connected via line 88 to the voltage source $V_{src}$ on the measuring unit 12. Further, the multiplexer chip U1 has two select input terminals S0, S1 on corresponding pins 14 and 2 which are connected via the lines 74a and 72a to the two lower significant bits of the first BCD code on the output terminals BCD2 and BCD1, respectively. Lastly, the multiplexer chip U1 has an output terminal ZB on pin 9 which is connected via line 90a to the first output channel connector BNC1.

In response to the first selected digit applied to the input line 70a of the switch 62 the first BCD code will appear on corresponding output terminals BCD1–BCD4 of the switch 62. It will be noted that the output terminals BCD3 and BCD4 are not used when only four multiplexer chips are present. The two upper significant bits of the BCD code permit the capability of handling more multiplexer chips and thus more input and output channel connectors.

Similarly, in response to the second selected digit applied on input line 70b of the switch 64, a second BCD code will appear on output lines 72b–78b via the output terminals BCD1–BCD4. The multiplexer chip U2 also has its four data input terminals on pins 10–13 coupled to the corresponding input channel connectors TRIAC1–TRIAC4 via the respective lines 80–86. The two select inputs S0, S1 on pins 14 and 2 of the multiplexer chip U2 are connected via the lines 74b and 72b to the two lower significant bits of the second BCD code of the switch 64. Likewise, the output terminal ZB on pin 9 of the multiplexer chip U2 is connected via line 90b to the second output channel connector BNC2.

Further, in response to the third selected digit applied on input line 70c of the switch 64, a third BCD code will appear on input lines 72c–78c via the output terminals BCD1–BCD4. The multiplexer chip U3 also has its four data input terminals on pins 10–13 coupled to the corresponding input channel connectors TRIAC1–TRIAC4 via the respective lines 80–86. The two select input terminals S0, S1 on pins 14 and 2 of the multiplexer U3 are connected via the lines 74c and 72c to the two lower significant bits of the third BCD code of the switch 66. Likewise, the output terminal ZB on pin 9 of the multiplexer chip U3 is connected via line 90c to the third output channel connector BNC3.

Finally, in response to the fourth selected digit applied on input line 70d of the switch 68, the fourth BCD code will appear on output lines 72d–78d via the output terminals BCD1–BCD4. The multiplexer chip U4 has also its four data input terminals on pins 10–13 coupled to the corresponding input channel connectors TRIAC1–TRIAC4 via the respective lines 80–86. The two select input terminals S0, S1 on pins 14 and 2 of the multiplexer chip U4 are connected via the lines 74d and 72d to the two lower significant bits of the fourth BCD code of the switch 68. Likewise, the output terminal ZB on pin 9 of the multiplexer chip U4 is connected via line 90d to the fourth output channel connector BNC4.

Assume that the four selected digits are 2, 4, 1, and 3, are as illustrated on the channel selector device 10 in FIGS. 1 and 2. In operation the first selected digit (2) applied to the first switch 62 will cause the first digital control signals to be generated on the lines 74a and 72a. The first digital control signals are fed to the select input terminal S0, S1 of the multiplexer chip U1 which will cause the signal (from the second output terminal connector SMU2) connected to the second input channel connector TRIAC2 of the channel selector device 10 to be supplied to the first probe 18 connected to the first output channel connector BNC1 of the channel selector device. Similarly, the second selected digit (4) applied to the second switch 64 will cause the second digital control signals to be generated on the lines 74b and 72b. The second digital control signals are fed to the select input terminals S0, S1 of the multiplexer chip U2 which will cause the signal (from the fourth output terminal connector SMU4) connected to the fourth input channel connector TRIAC4 of the channel selector to be supplied to the second probe 18 connected to the second output channel connector BNC2 of the channel selector.

In addition, the third selected digit (1) applied to the third switch 66 will cause the third digital control signals to be generated on the lines 74c and 72c. These third digital control signals are fed to the select input terminals S0, S1 of the multiplexer chip U3 which will cause the signal (from the first output terminal connector SMU1) connected to the first input channel connector TRIAC1 of the channel selector to be connected to the third probe 18 connected to the third output channel connector BNC3 of the channel selector. Finally, the fourth selected digit (3) applied to the fourth switch 68 will cause the fourth digital control signals to be generated on the lines 74d and 72d. These fourth digital control signals are fed to the select input terminal S0, S1 of the multiplexer chip U4 which will cause the signal (from the third output terminal connector SMU3) connected to the third input channel connector TRIAC3 of the channel selector to be supplied to the fourth probe connected to the fourth output channel connector BNC4 of the channel selector device.

It should be apparent to those skilled in the art that while there is shown one-of-four multiplexer chips in the drawings, the one-of-N multiplexer chips could be used, where N is an integer greater than 1 in order to be able to handle more or less than the four output signals. Further, it will be noted that parallel connections could be made alternatively to the output terminal connectors BNC1–BNC4 so that other instruments could be connected thereto to provide measurements and/or visual indication of the input signals.

From the foregoing detailed description, it can thus be seen that the present invention provides a converter and digital channel selector device which includes a plurality of input channel connectors connected to receive a corresponding plurality of signals from an external source measurement unit, a plurality of output channel connectors connected to a corresponding plurality of probes, digital channel selector logic circuit responsive to digital input control signals for selectively applying each one of the plurality of signals from the external source measurement unit to any one of the corresponding plurality of probes. In other words, the channel selector device allows the user to quickly and easily connect selectively the corresponding signals on each one of its input channel connectors to be applied at any one of its corresponding output channel connectors. As a result, multiple input signals and/or measurements can be taken from the same configuration of the probes without requiring re-programming of the measurement unit or swapping of the probe connectors.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A manually-controlled converter and digital channel selector device for use with a source measurement unit and a probe station having a plurality of separate probes, said channel selector device comprising in combination:

said source measurement unit having a plurality of output terminal connectors connected to receive corresponding ones of a plurality of signals;

said probe station having a plurality of separate probes, each of which can be secured to different test points on a wafer of a semiconductor integrated circuit device;

said channel selector device including a plurality of input channel connectors being connected to corresponding ones of said plurality of output terminal connectors of said source measurement unit and a plurality of output channel connectors being connected to corresponding ones of said plurality of separate probes;

said channel selector device further including manually-controlled converter means for generating a plurality of digital control signals and digital channel selector logic circuit means responsive to said digital control signals for selectively connecting respective ones of said plurality of input channel connectors to any one of said plurality of output channel connectors, whereby said digital channel selector logic circuit means selectively applies each one of the plurality of signals from the source measurement unit to any one of the corresponding plurality of discrete separate probes;

wherein said manually controlled converter means is comprised of a plurality of code switch means for manually encoding selected digits into BCD code signals defining said plurality of digital control signals;

wherein said code switch means is comprised of a plurality of thumbwheel switches in which the selected digits can be manually controlled by a user;

wherein said digital channel selector logic circuit means is comprised of a plurality of multiplexer circuits, wherein each of said multiplexer circuits has a plurality of input terminals, wherein each of the plurality of output terminal connectors of said source measurement unit are connected to an input terminal of each of said multiplexer circuits, where in an output terminal of each of said multiplex circuits is connected to a respective one of the plurality of discrete probes; and wherein each respective one of said multiplexer circuits is manually controlled by a respective one of said manually-controlled thumbwheel switches to selectively connect an input terminal of said multiplexer circuits to its output terminal.

2. A channel selector device as claimed in claim 1, wherein each of said plurality of muliplexer circuits is comprised of an I.C. multiplexer chip of the 74153 type.

3. A channel selector device as claimed in claim 1, wherein each of said plurality of input channel connectors is comprised of a TRIAC-type connector.

4. A channel selector device as claimed in claim 1, wherein each of said plurality of output channel connectors is comprised of a BNC-type connector.

5. A channel selector device as claimed in claim 1, wherein said source measurement unit is comprised of a HP4145 Semiconductor Parameter Analyzer.

6. A channel selector device as claimed in claim 1, wherein each of said output terminal connectors is comprised of a TRIAC-type connector.

* * * * *

UNITED STATES PATENT AND TRADEMARK OFFICE
CERTIFICATE OF CORRECTION

PATENT NO. : 5,600,236
DATED : February 4, 1997
INVENTOR(S) : Haley et al.

It is certified that error appears in the above-identified patent and that said Letters Patent is hereby corrected as shown below:

On the title page, item [73] Assignee should be:

"VLSI Technology, Inc.".

Signed and Sealed this

Sixth Day of July, 1999

*Attest:*

Q. TODD DICKINSON

*Attesting Officer*   Acting Commissioner of Patents and Trademarks